(12) United States Patent
Rossel et al.

(10) Patent No.: US 8,470,681 B2
(45) Date of Patent: Jun. 25, 2013

(54) RESISTOR WITH IMPROVED SWITCHABLE RESISTANCE AND NON-VOLATILE MEMORY DEVICE

(75) Inventors: Christophe P. Rossel, Richterswil (CH); Michel Despont, Au (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/411,610

(22) Filed: Mar. 4, 2012

(65) Prior Publication Data

US 2012/0164813 A1     Jun. 28, 2012

Related U.S. Application Data

(62) Division of application No. 12/538,317, filed on Aug. 10, 2009, now Pat. No. 8,129,250, which is a division of application No. 11/177,119, filed on Jul. 8, 2005, now abandoned.

(30) Foreign Application Priority Data

Jul. 9, 2004 (EP) ...................................... 04405439

(51) Int. Cl.
*H01L 21/20*     (2006.01)

(52) U.S. Cl.
USPC .................. 438/382; 438/385; 257/E27.006; 257/E21.495; 257/E21.294

(58) Field of Classification Search
USPC ........... 438/382, 385; 257/E29.176, E27.006, 257/E21.495, E21.294
See application file for complete search history.

(56) References Cited

U.S. PATENT DOCUMENTS 5,534,711 A * 7/1996 Ovshinsky et al. ............... 257/3

\* cited by examiner

*Primary Examiner* — Julio J Maldonado
*Assistant Examiner* — Amar Movva
(74) *Attorney, Agent, or Firm* — Michael J. Buchenhorner; Vazken Alexanian

(57) ABSTRACT

A resistor with improved switchable resistance includes a first electrode, a second electrode, and an insulating dielectric structure between the first and second electrodes. The insulating dielectric structure includes a confined conductive region providing a first resistance state and a second resistance state; the resistance state of the confined conductive region being switchable between the first and second resistance states by a control signal.

8 Claims, 8 Drawing Sheets

RESISTOR WITH IMPROVED SWITCHABLE RESISTANCE AND NON-VOLATILE MEMORY DEVICE

CROSS-REFERENCE TO RELATED APPLICATIONS

This application is a division of, and claims priority from, U.S. patent application Ser. No. 12/538,317, filed on Aug. 10, 2007; which application is itself a division of, and claims priority from, U.S. patent application Ser. No. 11/177,119, filed on Jul. 8, 2005, which is incorporated by reference in its entirety as if fully set forth herein.

FIELD OF THE INVENTION

The present invention is directed to a resistor with bi-stable switchable resistance, to a non-volatile memory cell and a non-volatile memory device with the resistor, and to a method for fabricating an insulating dielectric structure with a confined conductive region.

BACKGROUND OF THE INVENTION

For memory devices and for numerous other applications, bi-stable devices or circuits are used. For example, for storing one bit of information in a memory, a bi-stable device can be used which is switchable between (at least) two different and persistent states. When writing a logical "1" into the device, it is driven into one of the two persistent states and when writing a logical "0", or erasing the logical "1", the device is driven into the other of the two different states. Each of the states persists until a next step of writing information into the device or erasing information in the device proceeds. A huge number of such bi-stable devices arranged in one or more arrays may form an EEPROM (EEPROM stands for electrically erasable programmable read-only memory) as a separate memory device or as part of an even more complex device.

An example for such a bi-stable device is a resistor with two (or more) reversibly switchable and persistent resistance-states. The resistor is made of a material with respective reversibly switchable and persistent conductivity states. The conductivity states of the resistor are changed by applying short voltage or current pulses to the resistor. These pulses should be larger than a given threshold $V_T$. The conductivity state of the resistor can be read or analyzed by applying other pulses which are non-destructive to the conductivity state if they are much smaller than $V_T$.

U.S. Pat. No. 6,204,139 describes a method for switching properties of perovskite materials used in thin film resistors. The properties, in particular the conductivity, are switched reversibly by short electrical pulses. Application of the method for non volatile memory units and for sensors with changeable sensitivity is proposed.

U.S. Pat. No. 6,531,371 describes an electrically programmable resistance cross point memory. At cross points of bit lines and word lines, perovskite material acts as variable resistors the resistance values of which can be changed reversibly and with hysteresis.

U.S. 20030156445 A1 describes a method of changing the resistance of a perovskite metal oxide thin film device by means of a resistance change producing pulse. The articles "Reproducible switching effect in thin oxide films for memory applications" (A. Beck et al., Applied Physics letters, Vol. 77, No. 1, July 2000) and "Current-driven insulator conductor transition and non-volatile memory in chromium-doped SrTiO.sub.3 single crystals" (Y. Watanabe et al., Applied Physics Letters, Vol. 78, No. 23, June 2001) and the international application publication WO 00/49659 A1 describe materials and classes of materials with hysteretically switchable electrostatic resistance, and simple resistor devices made from these materials.

The article "Electrical current distribution across a metal-insulator-metal structure during bistable switching" (C. Rossel et al., Journal of applied Physics, Vol. 90, No. 6, September 2001) provides evidence that bi-stable switching is localized to filaments.

In thin films, clear evidence was given that one or several current filaments can occur. The high or low resistance state of the thin film or a memory cell comprising the thin film is correlated with the number of filaments and with the intensity of each filament.

The filaments do not exist in recently fabricated materials. Rather, after fabrication of a device, one or several filaments are generated in a forming process before the device or, to be more specific, the filament, can be switched between two or more resistant conductivity states.

The forming process is voltage controlled. Its success or duration depends on several parameters of the insulator or dielectric material (stoichiometry, doping, and thickness) and of the electrodes and on ambient conditions such as the temperature. In a large number of devices, for example in a large number of storage cells in an integrated memory device, the number, intensity and position of the filaments in each cell are more or less randomly distributed. As a consequence, the electronic and electrical properties of the single storage cells are randomly distributed, as well. The time-consuming and hardly reproducible forming process and the variability of the properties of the memory cells are severe drawbacks of conventional resistors with bi-stable switchable resistance and of devices comprising such a resistor.

SUMMARY OF THE INVENTION

Therefore, it is an aspect of the present invention to provide resistors with bistable switchable resistance, methods for fabricating a resistor with bistable switchable resistance, and methods for forming a switching resistance filament in a dielectric material which facilitate a filament forming. This is faster and easier to perform and produces more reproducible results.

Thus, an aspect of the present invention provides a resistor including a first electrode, a second electrode facing the first electrode and a resistance structure between the first electrode and the second electrode. The resistance structure comprises an insulating dielectric material in which a confined conductive region is formed between the first and second electrode. A perturbation element locally exerts mechanical stress on the resistance structure in the vicinity of the perturbation element at least during a forming process in which the confined conductive region is formed. The perturbation element is also referred to as stressing or straining element. In general, the perturbation element causes a local stress in order to induce a local strain field.

Furthermore, there is provided a method for fabricating an insulating dielectric structure with a confined conductive region through the insulating dielectric structure, wherein a confined strain field is generated at a predetermined position, thereby providing a predetermined position for the confined conductive region.

According to another aspect of the invention there is provided a method for forming a confined conductive region in an insulating dielectric material.

According to a further aspect of the present invention there is provided a non-volatile memory cell including a resistor as mentioned above.

According to yet another aspect of the invention there is provided a non-volatile memory device including a non-volatile memory cell and a controller for writing and reading the memory cell.

According to another particular aspect of the invention there is provided a method for fabricating a resistor with bistable switchable resistance.

The present invention provides the advantage that the conductive filament is localized to the confined strain field which in term is generated at a predetermined position. As a consequence of the localization, there is a high probability that only one filament is generated. Furthermore, the localization of the filament results in a high reproducibility of the electronic and electric properties of the device.

BRIEF DESCRIPTION OF THE DRAWINGS

These and other objects and features of the present invention will become clear from the following description taken in conjunction with the accompanying drawings in which.

Figure 1:
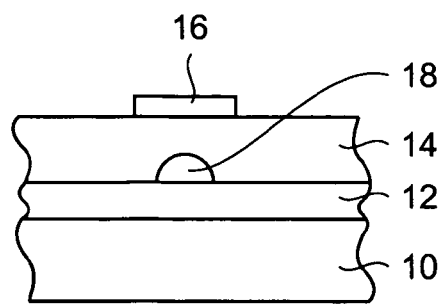
FIGS. 1 to 7 are schematic cross-sections of several preferred embodiments.

REFERENCE NUMERALS 10 substrate
12 first electrode
14 resistance structure or insulating dielectric material
16 second electrode
18 perturbation element
22 bottom electrode
24 backside of the substrate
26 front surface of the substrate
28 point of the first electrode
30 insulation layer
42 piezo element
44 metal plug
46 further insulation layer
48 protrusion of the first electrode
52 buried oxide layer
56 semiconductor membrane
58 conductor element
60 line
64 CMOS-layer
68 edge
72 cavity
74 mask
76 opening
78 layer
80 bistable switchable resistor
82 line
84 line
88 additional layer
92 first step 94 second step
96 third step
98 fourth step

DESCRIPTION OF THE INVENTION

The present invention provides resistors with bistable switchable resistance, methods for fabricating a resistor with bistable switchable resistance, and methods for forming a switching resistance filament in a dielectric material which facilitate a filament forming process which is faster and easier to perform and produces more reproducible results.

In accordance with an example embodiment of the present invention provides a resistor. The resistor includes a first electrode, a second electrode facing the first electrode and a resistance structure between the first electrode and the second electrode. The resistance structure comprises an insulating dielectric material in which a confined conductive region is formed between the first and second electrode. A perturbation element locally exerts mechanical stress on the resistance structure in the vicinity of the perturbation element at least during a forming process in which the confined conductive region is formed. The perturbation element is also referred to as stressing or straining element. In general, the perturbation element causes a local stress in order to induce a local strain field.

In accordance with an example embodiment of the present invention provides there is also provided a method for fabricating an insulating dielectric structure with a confined conductive region through the insulating dielectric structure, wherein a confined strain field is generated at a predetermined position, thereby providing a predetermined position for the confined conductive region.

In accordance with an example embodiment of the present invention, there is provided a method for forming a confined conductive region in an insulating dielectric material. The method included the step of applying a forming signal to the insulating dielectric material, wherein a piezoelectric element is activated in order to locally exert mechanical stress to the insulating dielectric material during the application of the forming signal.

In accordance with another example embodiment of the present invention, there is provided a non-volatile memory cell. The non-volatile memory cell includes a resistor as mentioned above, wherein the confined conductive region provides a first or low resistance state and a second or high resistance state, wherein the resistance state of the confined conductive region is switchable between the first resistance state and the second resistance state by a control signal, and wherein the resistance state of the confined conductive material indicates the information stored in the memory cell.

In accordance with another example embodiment of the present invention, there is provided a non-volatile memory device including the non-volatile memory cell and a controller for writing and reading the memory cell.

In accordance with another example embodiment of the present invention, there is provided a method for fabricating a resistor with bistable switchable resistance. The method includes the steps of: producing a first electrode; producing an insulating dielectric structure according to the inventive method for fabricating an insulating dielectric structure, the insulating dielectric structure being formed adjacent to the first electrode, the confined conductive region providing a first of low resistance state and a second or high resistance state and the resistance state of the confined conductive region being switchable between the first resistance state and the second resistance state by a control signal, and producing a second electrode adjacent to the insulating dielectric structure.

The present invention is employs an idea to localize the generation of a confined conductive region and in particular of a conductive filament to a predetermined position, thereby controlling the number of filaments to be one and the electronic properties of this filament. Further, the present invention is based on the cognition that filaments are predominantly generated in regions with enhanced concentration of microscopic material defects and in regions with enhanced electrostatic fields. This cognition is utilized for the approach to generate a confined elastic strain field at a predetermined position in the dielectric material, thereby providing a predetermined position for the filament.

Microscopic material defects are generated concentrated in a strain field or even attracted by a strain field. Furthermore, the dielectric constant of the material is altered in the strain field which—depending on the conditions—results in an enhanced electrostatic field. Presumably, both mechanisms are responsible for the localization of filaments in strain fields.

The strain field localizing the generation of a conducting filament may be generated in numerous ways. A preferred way of generating a strain field is by temporal or continuous application of mechanical stress, e.g. compressing, stretching, twisting or shearing stress. This stress causes an elastic and/or plastic deformation which is a kind of strain. Furthermore, almost any perturbation such as topographic, geometric and/or structural changes within the dielectric material or in adjacent structures causes a local strain field. In particular, a thickness variation of the dielectric material layer, a composition variation, induced defects such as dislocations, point defects or defect clusters or even columnar defects produced by ion irradiation or a combination of electrical stress, heat treatment and illumination are appropriate for producing a strain field. For example, irradiation with particles causes an amorphization of the lattice of the dielectric material along the path of the incoming particles. As the opposite example, an amorphous material may be locally transformed to a crystalline structure.

The strain field needs not to be persistent. Rather, the strain field may be temporarily generated during the forming process, for example by a piezoelectric actor. In other words, the strain field may be plastic or elastic. After the formation process, the strain field is no longer relevant.

The present invention provides the advantage that the conductive filament is localized to the confined strain field which in term is generated at a predetermined position. As a consequence of the localization, there is a high probability that only one filament is generated. Furthermore, the localization of the filament results in a high reproducibility of the electronic and electric properties of the device. According to the present invention, a non-volatile memory device including a huge number of memory cells in an array, provides a very low statistical spread of the threshold voltages required for storing information in each memory cell and of the signals received from each memory cell when information is read there from. These beneficial properties improve the operational reliability and facilitate miniaturization and low power operation.

Before the embodiments are described with reference to the Figures the terms stress and strain are addressed briefly. Stress is contemplated as a constraining force, a force exerted when one body or body part presses on, pulls on, pushes against, compress or twists another body or body part, but also the deformation caused in a body by such a force. Strain is contemplated as a deformation of a material body under the action of applied forces.

FIG. 1 is a schematic view of a vertical cross-section of a resistor according to a first preferred embodiment. On a substrate 10, a first electrode 12 is provided. A layer of an insulating dielectric material 14 is deposited over the first electrode 12. The insulating dielectric material 14 is also referred to as resistance structure 14. A second electrode 16 is deposited on the insulating dielectric material 14 in such a way that the insulating dielectric material 14 is at least partially sandwiched between the first electrode 12 and the second electrode 16. The insulating dielectric material 14 is a material in which conductive filaments with bistable switchable resistance can be formed by applying a forming signal in the form of a sufficiently strong electric pulse to the material 14. Alternatively, the insulating dielectric material is a material in which conductive filaments can be formed by applying a heat pulse, a pressure pulse or any other forming signal.

As an additional feature, the resistor shown in FIG. 1 comprises a perturbation element 18 which is positioned at the border face between the first electrode 12 and the insulating dielectric material 14. The perturbation element 18 advantageously abuts to the first electrode 12 and protrudes into the insulating dielectric material 14 towards the second electrode 16. The perturbation element 18 generates a mechanical strain field in the insulating dielectric material 14.

Stress generated by the perturbation element 18, hereafter also referred to as stressing or straining element 18, can produce a density mismatch, a lattice mismatch or local defects. The stress can relax in several ways to minimize the strain energy, e.g. by creating atom dislocations, interstitial atoms or by reconstruction. Reconstruction and relaxation normally alter the topology of any continuous network, or crystal lattice.

The strength of the strain field produced by the mechanical strain depends on numerous parameters, in particular on the properties of the insulating dielectric material 14 and its crystal lattice, and on the surface of the straining element 18, on the geometry etc. However, the strain field is in any case confined to the vicinity of the straining element 18. At a distance large compared to the dimensions of the straining element 18 and to the thickness of the insulating dielectric material 14, the strain generated by the straining element 18 vanishes.

The straining element 18 is a perturbation of the otherwise "perfect" geometry of the resistor consisting of flat layers with parallel surfaces each. In particular, the straining element 18 locally perturbates the insulating dielectric material 14. Whereas otherwise there would be no strain or a homogeneous strain field in the insulating dielectric material 14, the straining element 18 adds a local strain field.

A further effect of the straining element 18 is a local enhancement of the electrical field in the insulating dielectric material. This enhancement contributes to the localization of the filament in the first embodiment, too.

The straining element 18 has the shape of a microtip or dot which is grown, deposited or etched on the first electrode 12. Its shape may be the shape of a semi-spherical hillock as shown in FIG. 1. The straining element 18 is made of a metal, such as Pt, Mo or W, a metallic oxide, such as $SrRuO_3$ or $RuO_2$, a silicide, such as $CoSi_2$, a nitride, such as TaN, $W_2N$, or a combination thereof. According to preferred embodiments the straining element 18 can be grown epitaxially or not, can be monocrystalline, polycrystalline or amorphous and can be integral with the first electrode 12. Preferentially, the straining element 18 can be integral with the first electrode 12 and made of a highly doped Si region. Advantageously, the size and shape of the straining element 18 and the film thickness of the insulating dielectric material 14 are optimized to generate the maximum local strain and to optimize the localization of the filament to be formed and the electronic and electrical properties of the filament.

The insulating dielectric material 14 is advantageously a doped or undoped oxide such as $SrZrO_3$, $SrTiO_3$, $BaSrTiO_3$ or any other perovskite or any binary, ternary or multinary compounds as already described in the above-mentioned international application publication WO 00/49659 A1. The insulating dielectric material 14 can be amorphous, polycrystalline or epitaxial. It can be grown by means of multiple techniques such as MBE, MOCVD, CVD, ALD, CSD, sol-gel, PLD, sputtering, and so forth.

After fabricating the resistor shown in FIG. 1 initially no conducting filament exists in the insulating dielectric material 14. The filament is generated in a forming process. The forming process is preferably caused by applying a predetermined voltage to the insulating dielectric material 14 via the electrodes 12, 16. This predetermined voltage and the duration of its application are set or tuned such that no local melting of the insulating dielectric material 14 and no other kind of irreversible destructive breakdown occurs. This condition supplies upper limits for the size of the forming signal, in particular for the duration and the voltage of the forming signal.

On the other hand, the forming process depends on the properties of the insulating dielectric material 14 (stoichiometry, doping, thickness, presence and density of lattice defects etc.), on the material, the surface properties and the shape of the electrodes 12, 16, on the temperature and on other ambient parameters. Therefore, the forming process needs to be strong enough to make sure that a filament is formed.

It is an eminent advantage of the present invention to make the forming process far more reliable and to render the tuning of the forming signal far less critical and thus much easier. The reason for this will be explained subsequently.

The region where the local strain field is generated by the straining element 18 is by far the most probable place where a filament forms. Therefore, the position of the filament is effectively predefined to be a position in the strain field. Most probably, the filament forms at the place of maximum strain field. Thus, the position of the filament is predefined to a high degree.

A particular parameter which is well-controlled and rather sharply defined if the filament position is predefined is the period of time between the start of the forming signal and the moment of filament forming. Therefore, the duration of the forming signal required for a secure filament forming process is considerably shortened by the present invention.

Another advantageous aspect is that the forming of two or more parallel filaments is very unlikely. One reason is the predefinition of the position of the filament and is described above. The other reason is that the forming signal can be made much shorter or smaller than conventionally as was also described above.

Both the well-defined number of filaments (to be one) and the well-defined position of the filament results in well-defined properties of the resistor which are reproducible to a high degree.

First tests showed that the single filament is rather stable and—with the above described materials—exhibits two levels or multilevel switching. The separation of these levels can be controlled easily by the amplitude and duration of a writing pulse which is a control signal controlling the resistance state of the filament.

In the following the same references or reference numerals are used to denote the same elements, parts, or the like.

Figure 2:
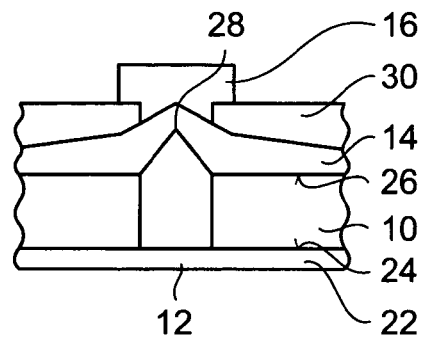

FIG. 2 is a schematic vertical cross-section of a resistor according to a second preferred embodiment. In this embodiment, the first electrode 12 is a metal plug in a through-hole in a substrate 10. The first electrode 12 is in electrically conductive contact with a bottom electrode 22 on the backside 24 of the substrate 10. The first electrode 12 protrudes from a front surface 26 of the substrate 10 in the form of a cone or a pyramid. Thereby, it forms a tip or point 28 directed towards the second electrode 16. The second electrode 16 comprises a negative shape corresponding to the shape of the first electrode 12. An insulating dielectric material 14 is sandwiched by the first electrode 12 and the second electrode 16. It is deposited more or less uniformly over the first electrode 12 before the second electrode 16 is deposited.

In the vicinity of the point 28 formed by the first electrode 12, the insulating dielectric material 14 is provided in a geometric shape which strongly deviates from a flat layer with parallel surfaces. As an automatic consequence of this shape, a strain field exists in the insulating dielectric material 14 which is concentrated in the vicinity of the point 28 of the first electrode 12. Therefore, during a forming process a filament is (most probably) formed between the point 28 of the first electrode 12 and the second electrode 16.

Thus, the tip 28 is a straining element the effect of which is similar to that of the straining element 18 of the embodiment shown in FIG. 1.

The point 28 is also a place of an enhanced electrical field if a voltage is applied to the first electrode 12 and the second electrode 16. This local enhancement of the electrical field further assists the forming of the filament at the predefined position of the point 28 and allows for the same results at a lower voltage.

An insulation layer 30 on top of the insulating dielectric material 14 provides only a small hole in the vicinity of the point 28 of the first electrode 12 through which the second electrode 16 is in contact with the insulating dielectric material 14. Thereby, the insulation layer 30 assists in the focalization of the electric field and prevents the filament from forming in other places in the insulating dielectric material 14.

Figure 3:
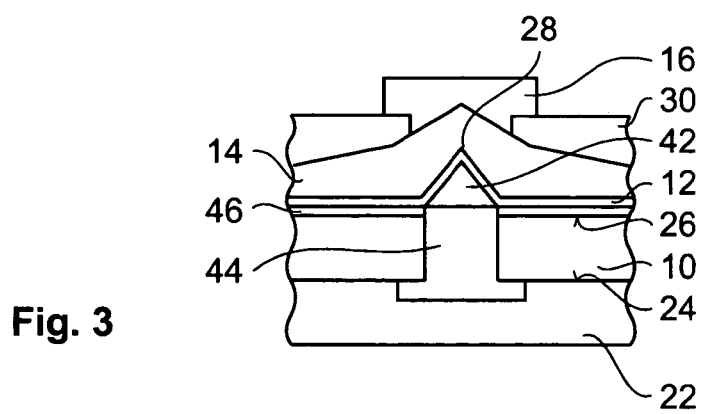

FIG. 3 is a schematic view of a vertical cross-section through a resistor according to a third preferred embodiment. A piezo-element 42 made of a piezoelectric material protrudes from the front surface 26 of the substrate 10 in the form of a cone or a pyramid or a prism or in any other convex form. A metal plug 44 or any other electrically conductive structure connects the piezo-element 42 to a bottom electrode 22 on the backside 24 of the substrate 10.

The first electrode 12 at least partially covers the surfaces of the piezo-element 42 protruding from the front surface 26 of the substrate 10. Thereby, the first electrode 12 of the third embodiment is an example for an electrode including a protrusion, or convex feature, which is caused by an element positioned between the electrode and the substrate.

The insulating dielectric material 14 is deposited on top of the first electrode 12 in a more or less uniform manner. In the vicinity of the point 28 of the first electrode 12, the insulating dielectric material 14 is sandwiched between the first electrode 12 and a second electrode 16. The insulating layer 30 covers most of the insulating dielectric material 14. The insulating layer 30 has a small hole in the vicinity of the point 28 through which the second electrode 16 is in contact with the insulating dielectric material 14. A further insulation layer 46 provides secure electrical insulation of the first electrode 12 from the substrate 10.

The geometry or shape of the first electrode 12, the second electrode 16, the insulating dielectric material 14 and the insulating layer 30 are rather similar to the embodiment shown in FIG. 2. Again, the point 28 of the first electrode 12 is a straining element exerting mechanical strain and generating a strain field in the insulating dielectric material 14 in the vicinity of the point 28.

However, the third embodiment shown in FIG. 3 differs from the second embodiment shown in FIG. 2 in that additional mechanical strain can be produced by activating the piezo-element 42. This is done by applying an appropriate voltage between the first electrode 12 and the bottom electrode 22. The resulting deformation of the piezo-element 42 exerts a force on the insulating dielectric material 14 via the thin first electrode 12. In this manner, the deformation of the piezo-element 42 modifies the strain field in the insulating dielectric material 14.

Thus, the third embodiment can be referred to as an active tip or active hillock embodiment since the tip or hillock formed by the first electrode 12 protruding into the insulating dielectric material 14 is actively distorted by the piezo-element 42. This active feature may serve to compensate for possible variations in the fabrication in the resistor and thereby to further improve the reproducibility in the forming process and thus in the switching of the resistor. This is particularly advantageous if the resistor is part of a memory cell of a non-volatile memory device as it will be described below with respect to FIG. 21.

According to a variation of the third embodiment shown in FIG. 3, the piezo-element 42 is arranged such that the first electrode 12 and the second electrode 16 are flat and sandwich a flat layer of the insulating dielectric material 14 with laterally homogeneous thickness. This means that the piezo-element 42 does not protrude from the front surface 26 of the substrate 10. In this case, there is no strain or only a laterally homogeneous strain field in the insulating dielectric material 14. A localized strain field with the effects described above with respect to the first to third embodiment is generated temporarily when the piezo-element 42 is active.

Whereas in the third embodiment shown in FIG. 3, the point 28 of the first electrode 12 as well as the piezo-element 42 are straining elements exerting strain on the insulating dielectric material 14, in the latter variation of the third embodiment, there is only one straining element, namely the piezo-element 42. Whereas in the third embodiment, a (weaker) strain field permanently exists in the insulating dielectric material 14, in the latter variation of the third embodiment, a strain field is generated only as long as the piezo-element 42 is activated by a voltage during the formation process. After the formation of a filament, a strain field is not required anymore. Therefore, the piezo-element 42 can be decommissioned.

Figure 4:
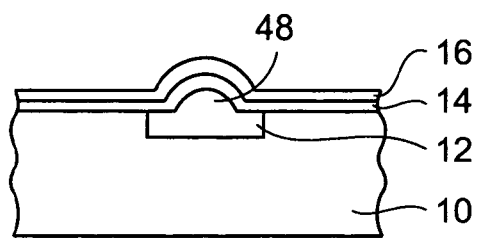

FIG. 4 is a schematic view of a vertical cross-section of a resistor according to a fourth embodiment. Again, on top of the substrate 10 the insulating dielectric material 14 is sandwiched between the first electrode 12 and the second electrode 16. The first electrode 12 comprises a protrusion 48 directed towards the second electrode 16. The protrusion 48 causes a deviation of the shape of the layer of the insulating dielectric material 14 from the flat form with parallel plane surfaces and a laterally constant thickness. Thereby, the protrusion 48 of the first electrode 12 generates a local strain field in the insulating dielectric material 14. The effect of this strain field is the same as in the above-described embodiments 1 to 3.

Figure 5:
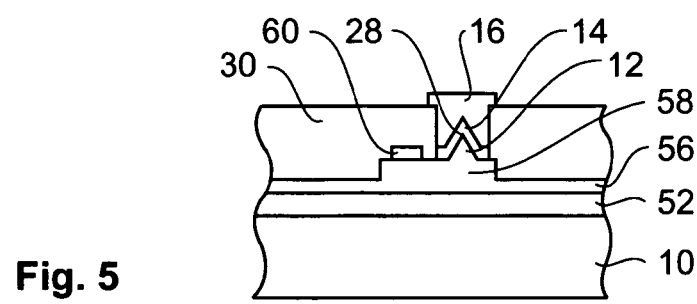

FIG. 5 is a schematic view of a vertical cross-section of a resistor according to a fifth preferred embodiment. An SOI wafer (SOI=silicon on isolator) comprises a bulk silicon substrate 10, a buried oxide layer (BOX-layer) 52 (isolator) and a highly doped semiconductor membrane 56 (silicon). The upper semiconductor membrane 56 is locally thickened or vertically expanded to form a conductor element 58. The first electrode 12 in the form of a cone or pyramid or prism is integral with the conductor element 58. The insulating dielectric material 14 is deposited over the first electrode 12 in the form of a more or less uniform layer. The second electrode 16 is opposite to the first electrode 12 such that the insulating dielectric material 14 is sandwiched by the first electrode 12 and the second electrode 16. The first electrode 12 comprises the point 28. Similar to the preceding embodiments described above with reference to FIGS. 1 to 4, there is a strain field in the insulating dielectric material 14 in the vicinity of the point 28. Therefore, the point 28 is a straining element in this embodiment.

The conductor element 58 is connected to a line or trace 60. The rather thick insulating layer 30 essentially encases the conductor element 58, the first electrode 12, the insulating dielectric material 14, the second electrode 16 and the line 60.

Figure 6:
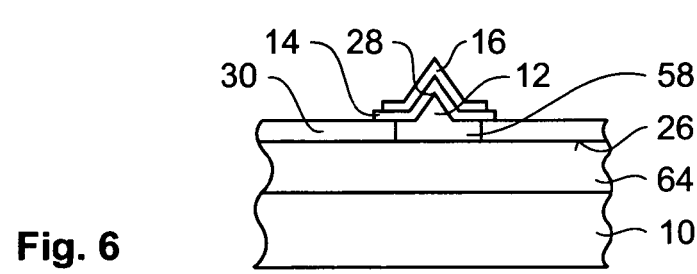

FIG. 6 is a schematic view of a vertical cross-section of a resistor according to a sixth preferred embodiment. The substrate 10 comprises at or below its front surface 26 a CMOS-layer 64. CMOS-circuits may be formed in the CMOS-layer 64, but are not displayed in FIG. 6. On the front surface 26 of the substrate 10, the conductor element 58 is positioned which might also provide a contact to the last via plug. The first electrode 12 is integral with the conductor element 58 and has the shape of a cone, pyramid, prism or the like with the point or edge 28 protruding away from the substrate 10. The conductor element 58 is embedded in then insulating layer 30 whereby the thickness of the insulation layer 30 is about equal to the thickness of a layer-like part of the conductor element 58. The insulating dielectric material 14 is deposited over the first electrode 12 in a more or less conform manner, i.e. with essentially constant thickness. The second electrode 16 is deposited over the insulating dielectric material 14 whereby the insulating dielectric material 14 is sandwiched between the first electrode 12 and the second electrode 16.

Like in the other embodiments, the second electrode 16 comprises a corresponding negative shape to the form of the first electrode 12. The insulating dielectric material 14 comprises a face that is arranged on the first electrode 12 negative shape of the first electrode 12. The face of the insulating dielectric material 14 that is arranged at the second electrode 16 has essentially the same shape as the first electrode 12.

Similar to the embodiments described above with reference to FIGS. 1 to 5, the point 28 of the first electrode 12 is a straining element forcing the insulating dielectric material 14 into a shape strongly deviating from a flat layer with parallel surfaces and thereby generating a strain field localized in the vicinity of the point 28. Again, the effect of the local strain field in the insulating dielectric material 14 in the vicinity of the point 28 is a strong localization of the position where a conducting filament is formed in the insulating dielectric material 14 during a forming process.

Figure 7:
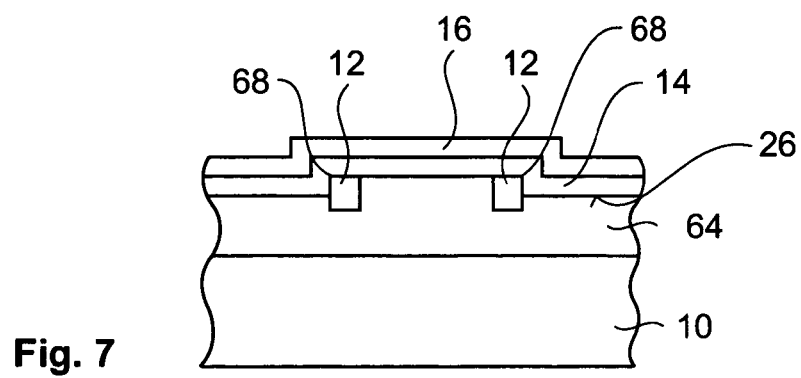

FIG. 7 is schematic view of a vertical cross-section of a pair of resistors according to a seventh preferred embodiment. At or below the front surface 26 of the substrate 10 the CMOS-layer 64 is formed. CMOS-circuits may be formed in the CMOS-layer 64, but are not displayed in FIG. 7. At the surface 26, first electrodes 12 are provided. Advantageously, each of the first electrodes 12 is part of a line or trace parallel to the surface 26 and vertical to the cross-section displayed in FIG. 7. Between the first electrodes 12, the thickness of the CMOS-layer 64 is larger than at other locations. Thereby, steps with edges 68 are formed, the edges 68 being edges of the first electrodes 12. The insulating dielectric material 14 is deposited over the CMOS-layer 64 and the first electrodes 12 in a more or less conformal manner. The second electrode 16 is deposited over the insulating dielectric material 14. Thereby, the insulating dielectric material 14 is sandwiched between the first electrode 12 and the second electrode 16.

The edges 68 of the first electrodes 12 force a deviation of the shape of the insulating dielectric material 14 from a flat layer, thereby generating a strain field in the vicinity of the edges 68 similar to the embodiments described above with reference to FIGS. 1 to 6. Thereby, the edges 68 are straining elements. Very similar to the embodiments 1 to 6 described above, the strain fields generated by the edges 68 cause a rather strong localization of filaments during a forming process.

Figure 8:
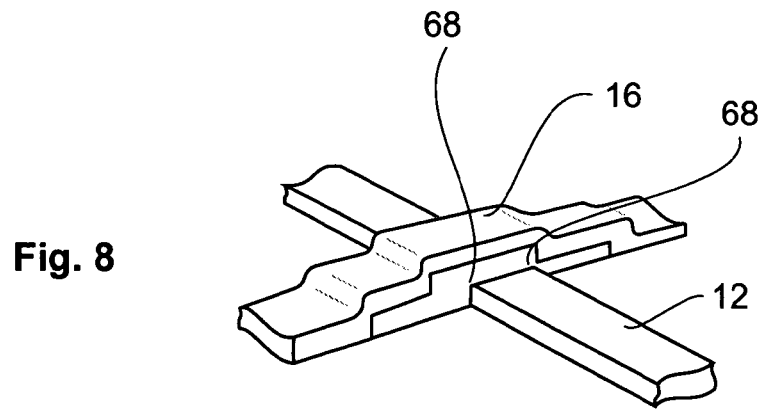
FIG. 8 is a schematic perspective view of another preferred embodiment.

FIG. 8 is a schematic perspective view of a resistor according to an eighth preferred embodiment. Lines or traces are arranged in the shape of a cross and form the first electrode 12 and the second electrode 16. At the cross point, the insulating dielectric material 14 is placed between the first electrode 12 and the second electrode 16. Edges 68 of the first electrode 12 force a shape of the insulating electric material 14 deviating from a flat layer and thereby generate strain fields in the insulating dielectric material 14 in the vicinity of the edges 68. As in the embodiments described above with reference to FIGS. 1 to 7, these strain fields localize the forming of filaments to the vicinity of the edges 68. Therefore, the edges 68 are straining elements.

First experimental results have been achieved with the eighth embodiments with first electrodes 12 and second electrodes 16 made from Pt and with TaOx as insulating dielectric material 14.

The embodiments 1 to 8 described above with reference to the FIGS. 1 to 8 have in common that a straining element forces a growth anisotropy of the insulating dielectric material 14 during its deposition over the first electrode 12. This growth anisotropy in turn results in a strain field localized in the vicinity of the straining element. In the embodiments 1 to 8 described above (but not in the variation of the third embodiment), the straining elements are geometric features of the first electrode 12, such as points or edges or other asperities. More generally speaking, any convex or concave features of the first electrode 12 or the second electrode 16 may serve as a straining element causing growth anisotropy and thereby the generation of a strain field. The stronger the deviation of the shape of the insulating dielectric material 14 from a flat layer with parallel surfaces, the stronger the growth anisotropy, the stronger the strain field and the stronger the localization of the filament forming. This means that the radius of curvature of the convex feature should be as small as possible.

Further, the lower the dimension of the geometric feature, the stronger the localization. Whereas an edge (which is a one dimensional feature) causes a strain field extended in one direction perpendicular to the filament to be formed, a point which is a zero-dimensional feature, causes a strain field localized in all three dimensions. Therefore, for many applications a point is more preferred than an edge since it results in a better localization of the strain field and the position of filament forming.

In the embodiments 1 to 8 described above with reference to FIGS. 1 to 8, the straining elements are convex geometrical features protruding into the insulating dielectric material 14. However, the straining element can be concave geometrical feature of the first electrode 12 and the second electrode 16, as well. However, it is clear that a convex feature of the first electrode 12 or the second electrode 16 causes an additional local enhancement of the electrical field which further improves the localization of the filament forming process.

According to a group of embodiments, nano or micro dots are produced which generate a controlled and reproducible material stress in a thin dielectric film on a metal layer which is integrated in or on a Si wafer or any other semiconductor substrate or any other type of suitable substrate. Thereby a line of localized traps with controlled lateral extension is produced. One approach is to create nanoscale metal islands in a regular array on the surface of a metallic substrate or a metallic film on any kind of substrate. These islands may be produced by evaporation through a mask or by any other pattern transfer method. One example for such a transfer method is the preparation of nanoscale Au islands in patterned arrays as it was described by M. V. Meli et al. in Langmuir letters 19, 9098 (2003). A further alternative is the deposition of ex-situ prepared nanoparticles using self assembly techniques (bloc copolymer self-assembly).

Furthermore, it is noted again that a straining element does not need to be a geometrical feature of the first electrode 12 or the second electrode 16. As it has already been described above with reference to the variation of the third embodiment, the straining element can be any other element locally exerting mechanical strain on the insulating electric material temporarily during a filament forming process or permanently.

Another example for a non-geometric straining element causing mechanical strain in the insulating dielectric material is a non-geometric inhomogeneity of the first electrode 12 or the second electrode 16. For example, a confined crystalline region within an otherwise amorphous electrode or a confined amorphous region within an otherwise crystalline electrode causes a growth anisotropy and thereby a strain field in the insulating dielectric material 14.

In the case of a thin epitaxial film, a sufficiently large lattice mismatch will generate enough strain energy to create local defects such as misfit dislocations.

Furthermore, a small particle embedded within the insulating dielectric material 14 or a structural inhomogeneity within the insulating dielectric material 14 may cause a strain field within the insulating dielectric material 14. For example, a confined crystalline region within an otherwise amorphous insulating dielectric material 14 or a confined amorphous region within an otherwise crystalline insulating dielectric material 14 causes a strain field (for example via the resulting density inhomogeneity). A confined amorphous region within a crystal is created by irradiation, for example.

A confined crystalline region within an otherwise amorphous insulating dielectric material can be generated by metal induced lateral crystallization (MILC) of amorphous Si, for example. Amorphous Si is deposited as the insulating dielectric material. A small metal dot including Al, Cu, Ag, Au or Ni is deposited on the amorphous Si layer. This causes a local crystallization to polycrystalline Si in the vicinity of the metal dot. This process is facilitated by implanted Ni ions in the amorphous Si and heating whereby $NiSi_2$ is created precipitating the crystallization as nucleation sites (see e.g. the laid-open Japanese application JP 825865 from 1997). Gilmer et al. describe a star-light growth by epitaxial growth of Si on HfSix nucleus (Applied Physics Letters 81, 1288 (2002)). An analysis by means of transmission electron microscopy indicates accelerated grain growth of polycrystalline Si on top of $HfO_2$. These give bright spots of star light in dark field optical microscope display. Other geometries and scenarios of MILC of amorphous material are possible and advantageous, as well.

The microscopic understanding of the conducting filament is that the conductance stems from a local enhancement of the density of ionized defects. The strain or stress exerted on the insulating dielectric material according to the present invention can relay either by creation interstitials or by reconstruction of the lattice. Both the relaxation and the reconstruction alter the topology of the continuous network of the crystal. By these mechanisms, the strain field produces or attracts all kinds of defects. These can be ionized to provide free charge carriers and, thereby, electrical conductivity.

Even if the forming process is left out of consideration, there is a qualitative difference between a conventionally doped region in a semiconductor and the conductive filament or confined conductive region according to the present invention. In the conventionally doped semiconductor region the free charge carriers are electrons or holes from ionized doping atoms, whereas in a confined conductive region according to the present invention, the free charge carriers stem from all kinds of ionized defects of the crystal. These defects comprise atoms with higher or lower valence than the atoms of the regular crystal (like doping atoms) and atoms which do not fit into the regularity of the crystal in other ways. However, in contrast to a conventionally doped material, these "doping atoms" are not introduced into the crystal by implantation or any other doping process but produced or attracted and concentrated by the local strain field. Attraction may take place by migration or diffusion from adjacent regions.

Figure 9:
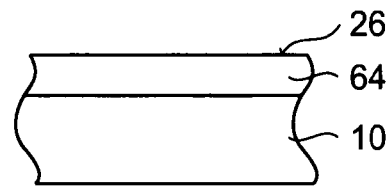
FIGS. 9 to 14 are schematic cross-sections of one preferred embodiment in different states during fabrication.
Figure 10:
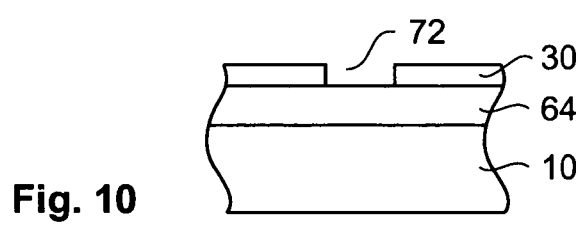
Figure 11:
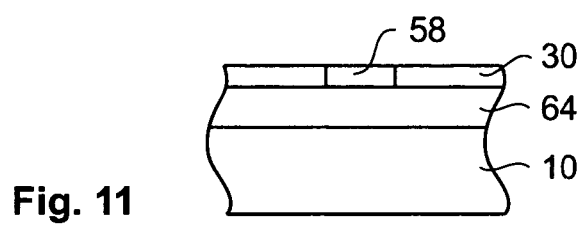

FIGS. 9 to 14 are schematic views of vertical cross-sections of the substrate 10 in different stages of production of the resistor according to the sixth embodiment described above with reference to FIG. 6. In a first step, the CMOS-layer 64 is formed at the front surface 26 of the substrate 10 (FIG. 9). The insulation layer 30 is deposited on the CMOS-layer 64 and laterally structured to form a cavity 72 (FIG. 10). This cavity 72 is filled with the material of the conductor element 58 (FIG. 11).

Figure 12:
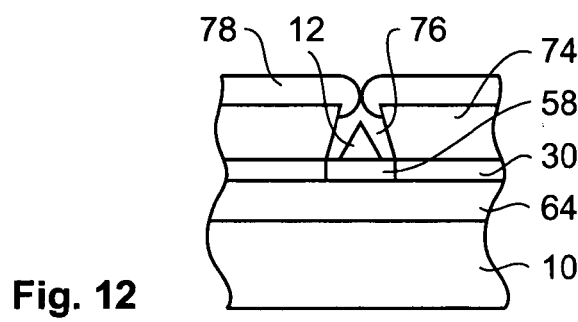

A mask 74 with an opening 76 over the conductor element 58 is deposited on the insulation layer 30. A conducting material which might be the same as the material of the conductor element 58 is deposited over the mask 74 and through the opening 76 on the conductor element 58. While a layer 78 on the mask 74 is growing, it increasingly closes the opening 76. Therefore, the lateral extension of the area on the conductor element 58 on which the conducting material is deposited is increasingly reduced. In this manner, the first electrode 12 is formed in the shape of a pyramid or a cone (FIG. 12).

Figure 13:
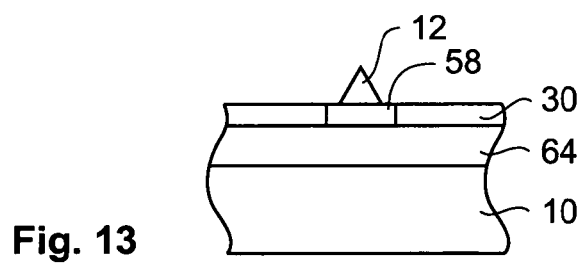
Figure 14:
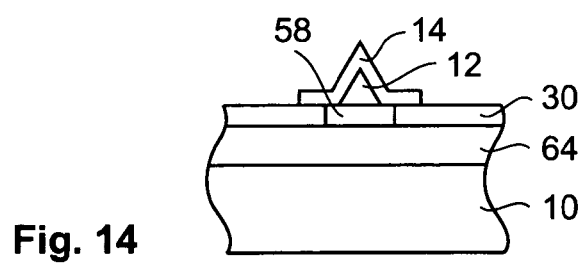

The mask 74 and the layer 78 are removed by a lift-off process (FIG. 13). The insulating dielectric material 14 is deposited over the first electrode 12 in a more or less conforming way resulting in an essentially constant layer thickness (FIG. 14). The second electrode 16 is deposited over the insulating dielectric material 14 to result in the structure of the sixth embodiment described above with reference to FIG. 6.

Figure 15:
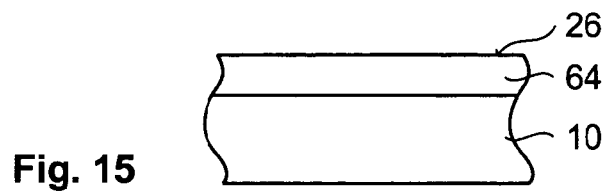
FIGS. 15 to 20 are schematic cross-sections of another preferred embodiment in different states during fabrication.
Figure 16:
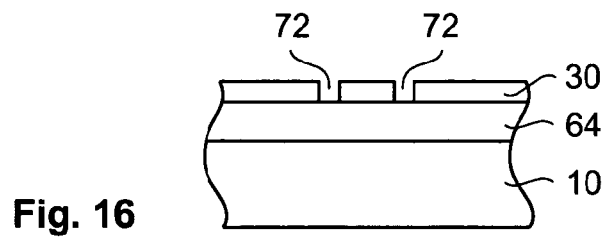
Figure 17:
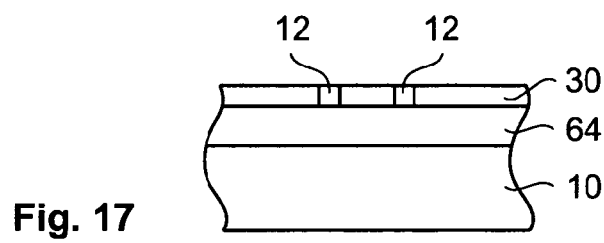
Figure 18:
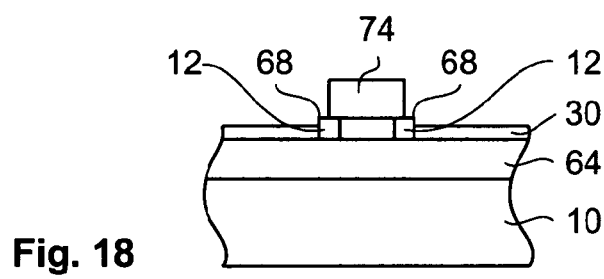

FIGS. 15 to 20 are schematic views of a substrate during different steps in a process of producing the resistor according to a ninth embodiment similar to the seventh embodiment described above with reference to FIG. 7. The CMOS-layer 64 is formed at the surface 26 of the substrate 10 (FIG. 15). The insulation layer 30 is deposited on the surface 26 and laterally structured to form cavities 72 (FIG. 16). These cavities 72 are filled with a conducting material to form the first electrodes 12. This is done by a deposition with subsequent chemical-mechanical polishing, for example (FIG. 17). The mask 74 is advantageously deposited by a self-aligning method and completely covers that part of the insulation layer 30 arranged between the first electrodes 12. The thickness of other parts of the insulation layer 30 is reduced by an etching process or the like. This results in steps at edges 68 of the first electrodes 12 (FIG. 18).

Figure 19:
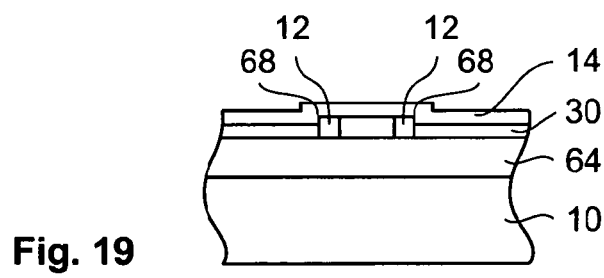
Figure 20:
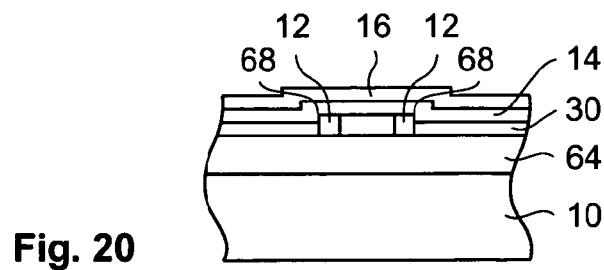

The insulating dielectric material 14 is deposited over the first electrode 12 and the insulation layer 30 in a more or less conformal manner (FIG. 19). The second electrode 16 is deposited over the insulating dielectric material 14 (FIG. 20). The effect of the edges 68 of the first electrodes 12 on the filament forming process is the same as in the seventh embodiment described above with reference to FIG. 7.

Figure 21:
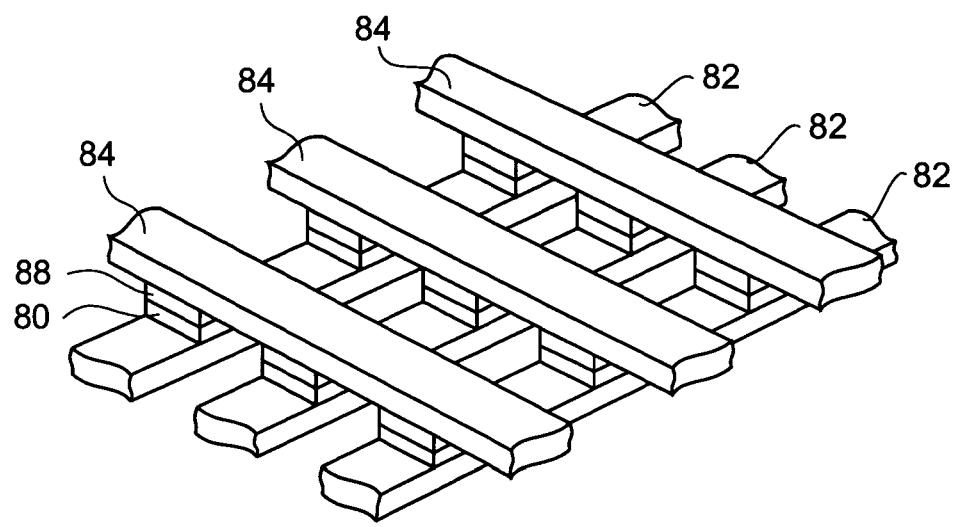
FIG. 21 is a schematic perspective view of a preferred embodiment.

FIG. 21 is a schematic perspective view of a rectangular array of resistors 80 according to the present invention as they have been described above in the embodiments 1 to 8. A first set of parallel electrically conductive traces or lines 82 extend along a first direction in a plane located on one side of the resistor array. Another set of parallel electrically conductive traces or lines 84 are arranged in another plane on the opposite side of the resistors 80 and are perpendicular to the first set of lines 82.

The first set of lines 82 serves as word lines of a non-volatile memory device. The second set of lines 84 serves as bit lines of the non-volatile memory device. The resistors 80 at each cross point of a word line 82 and a bit line 84 serve as memory cells. A controller is provided for applying an electrical writing signal to a selected one of the memory cells in order to write information into the memory cell. Further, the controller is provided for applying an electrical reading signal to a selected one of the memory cells in order to read information from the memory cell. The information is read by sensing or analyzing the resistance of memory cell.

Advantageously the writing signal and the reading signal are each voltage or current pulses. The amplitude and the duration of the writing signal are selected or set such that the resistance state of the resistor of the memory cell is altered by the signal. This condition is fulfilled if the amplitude exceeds a predetermined voltage or current threshold, for example. Advantageously the reading signal is considerably smaller than this threshold. Thus it does not alter the resistance state of the memory cell.

The resistance state of each resistor 80 corresponds to the information stored in the memory cell. For example, a low resistance state corresponds to a logical "0" and a high resistance state corresponds to a logical "1". As described above, the logic state of each memory cell or resistor, respectively, is altered by a writing signal or control signal and read by sensing or measuring its resistance state. If each of the resistors 80 provides more than two persistent resistance states more than one bit of information can be stored in one resistor 80.

FIG. 21 is a schematic representation of a memory device. In fact all the embodiments described above with reference to the FIGS. 1 to 8 are beneficially used as memory cells or as parts of memory cells of the memory device. In these above-described embodiments, one of the first electrode 12 and the second electrode 16 is connected to a respective word line and the other is connected to a respective bit line. As can be seen from the FIGS. 1 to 8, in each embodiment one of the electrodes 12, 16 is easily extended in the direction parallel to the cross section displayed and the other of the electrodes is easily extended in the direction perpendicular to the cross section displayed.

It is an advantage of the present invention that each memory cell consists of only one switchable resistor. No additional transistor, diode or other switch is necessary to isolate the memory cells from each other. During write or read operation, the selected memory cell can be isolated by applying an equal potential to the selected and other appropriate word and bit lines.

However, a shorted (faulty) memory cell can cause column-wide and row-wide errors. This problem can be overcome by introducing an additional stable resistor in series to the switchable resistor into each memory cell (EP 1 271 546 A2). This resistor can be fabricated as an additional layer 88 in the total stack of the memory element. This additional stable resistor in each memory cell is also called a finite series resistance element. With this finite series resistance element, a shortened switchable resistor in a memory cell produces only a randomized bit error during the read process which can be corrected by ECC faster and easier than a column-wide or row-wide failure.

Figure 22:
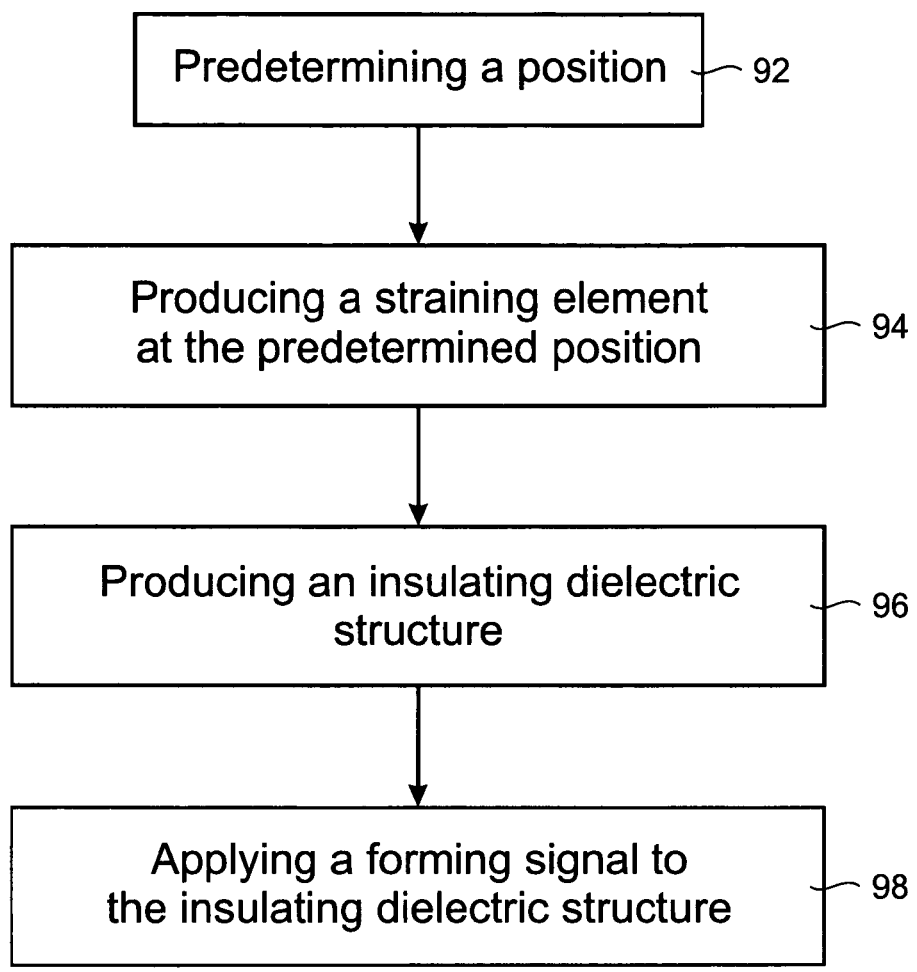
FIG. 22 is a flow chart of a method according to the present invention.

FIG. 22 is a schematic flow chart of a method of producing a bistable switchable resistor or a memory cell or a memory device based on the bistable switchable resistor. In a first step 92, the position for a conducting filament is predetermined. In a second step 94, a straining element is produced at the predetermined position. In a third step 96, an insulating dielectric structure is produced in the vicinity of the straining element. The straining element generates a strain field in the insulating dielectric structure. In a fourth step 98, a forming signal is applied to the insulating dielectric structure. This forming signal is e.g. a voltage or current pulse. It causes the conducting filament to form whereby the position of the conducting filament is predetermined by the position of the strain field generated by the straining element.

In the preceding embodiments, the invention is implemented in a resistor including the insulating dielectric material in which the conducting filament is formed or is to be formed. The insulating dielectric material together with the conducting filament is called a resistance material with bistable switchable resistance although the conductance and the bistable switchable resistance material property of the material are in fact localized in the conducting filament.

In the preceding embodiments, the insulating dielectric material is shaped as a non-flat layer with essentially constant thickness. This results in a shape of the interface between the second electrode and the insulating dielectric material which is very similar to the shape of the interface between the first electrode and the insulating dielectric material. In other words, the shape of the second electrode corresponds to the shape of the first electrode. Alternatively, the second electrode is shaped differently from the first electrode. If the insulating dielectric material is deposited in a less conform way, the geometry of the second electrode is less pronounced than that of the first electrode. If the insulating dielectric material is deposited completely non-conform, the second electrode is flat.

As a further alternative, the second electrode provides its own convex feature protruding towards the first electrode. This convex feature of the second electrode may serve as straining element exerting a strain on the insulating dielectric material.

However, the straining effect may be weaker than for the convex feature of the first electrode since it is deposited after the insulating dielectric material and does not influence its growth. Nevertheless it is noted that the second electrode may comprise the convex feature instead of the first electrode. This means that the first electrode and the second electrode are interchangeable.

The term "filament" also embraces implementations including a confined but more extended conductive region within the insulating dielectric material. In other words, although the bistable switching resistance property seems to be confined to thin filaments in at least some of the "bistable switching resistance materials" known and analyzed at present, the present invention is not limited to these thin filament cases. Rather, the present application is applicable advantageously to all materials in which a bistable switching resistance property is localized to a confined region even if this region is more extended than a thin filament.

It is noted that the term "bistable" does not exclude applications with more than two stable resistance states. Rather, the present invention is also applicable advantageously to materials with more than two persistent resistance states.

Further, it is noted that the persistent resistance states described in the above embodiments may be perfectly stable for an infinite period of time or may decay or vanish continuously or discontinuously within a certain period of time.

Further, it is noted that in the context of this application an insulating dielectric material is any material with a high specific resistance which is in particular higher or much higher than the specific conductivity within the confined electrically conductive region in its low resistance state.

In the embodiments described above, the conductive filaments are formed by applying sufficiently large voltage or current pulses to the material. However, it is clear from the above description that the forming process is not necessarily started or caused by an electric signal. Alternatively, an insulating dielectric material is used in which a forming process is caused or at least started or facilitated by applying a light pulse, a heat pulse, a pressure pulse or any other forming signal or a combination of two or more physical actions.

Further, the present invention is not limited to applications with a bistable switching resistance property. Rather, the present invention is advantageous for all applications in which a confined electrically conductive region within an insulating dielectric material is formed or is to be formed at a predetermined position. The position of the confined conductive region is self aligned to the position of the straining element.

One example for an application of such an insulating dielectric material with confined electrically conductive regions without a bistable switchable property is a display device. In this display device, each single pixel is electrically connected to a control circuit via one of the confined electrically conductive regions or filaments. The luminescence of each pixel may be controlled via the above described bistable switching resistance property of the confined electrically conductive region. Alternatively, the luminescence is controlled via another switching device associated with each pixel and connected to the pixel via the confined electrically conductive region. In the latter case, a bistable switching resistance property of the region is redundant. Further, the position of each pixel in a laterally homogeneous electroluminescent layer may be defined solely by the position of the confined electrically conductive region.

In all embodiments described above the first electrode, the insulating dielectric material and the second electrode are each extended in directions parallel to the surface of the substrate and are arranged in the form of a stack perpendicular to the surface of the substrate. Consequently, the filament is oriented essentially perpendicular to the substrate and the surface of the substrate. Alternatively, the first electrode, the insulating dielectric material and the second electrode are arranged laterally side by side at the surface of a substrate, and the filament is oriented parallel to the surface of the substrate.

In the preceding embodiments, the conducting filament is sandwiched between two electrodes. Electrical pulses are applied to the resistance material via these electrodes. Although an electrode is typically a metallic member, every electrically conductive solid state member is an electrode. However, alternatively only one electrode abuts to the resistance material. The other side of the resistance material may be in direct contact to an electrolyte, plasma or any other electrically conductive fluid. This may be advantageous in the above described display, for example. Further, both sides of the resistance material may be in contact with any electrically conductive material which is no electrode.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

We claim:

1. A method for fabricating a resistor with bistable or multi-stable switchable resistance, said method comprising steps of:
    producing a first electrode;
    depositing a perturbation element on the first electrode;
    depositing an insulating dielectric structure with a confined conductive region through said insulating dielectric structure over the first electrode, the confined conductive region providing a first resistance state and a second resistance state and the resistance state of the confined conductive region being switchable between the first resistance state and the second resistance state by a control signal;
    wherein the perturbation element locally exerts mechanical stress on the insulating dielectric structure located in a vicinity of said perturbation element at least during forming of the confined conductive region;
    wherein a position of the confined conductive region is self-aligned to a position of the perturbation element; and
    depositing the second electrode facing the first electrode with the insulating dielectric structure at least partially contained between said first electrode and the second electrode, wherein said second electrode comprises a shape corresponding to a negative of a shape of said first electrode.

2. The method of claim 1 wherein depositing the perturbation element comprises epitaxially growing the perturbation element.

3. The method of claim 1 wherein depositing the perturbation element comprises depositing a highly doped Si region.

4. The method of claim 1 wherein depositing the perturbation element comprises etching the perturbation element.

5. The method of claim 1 wherein depositing the perturbation element comprises depositing said perturbation element in a shape of a semi-spherical mound.

6. The method of claim 1 wherein depositing the insulating dielectric structure with the confined conductive region comprises depositing a confined crystalline region within an otherwise amorphous insulating dielectric material.

7. A method for forming a confined conductive region in an insulating dielectric material, said method comprising steps of:
    depositing a first electrode;
    depositing a perturbation element on the first electrode;
    depositing an insulating dielectric layer over the first electrode;
    wherein a protrusion in the first electrode generates a local strain field in the insulating dielectric material;
    depositing a second electrode;
    applying a forming signal to the insulating dielectric material deposited between the first electrode and a second electrode;
    depositing a piezoelement such that it is partially covered by the first electrode and protrudes in a convex form within the local strain field; and
    activating the piezoelectric element in order to locally exert mechanical stress to the insulating dielectric material during the application of the forming signal.

8. The method of claim 7 further comprising a step of:
    depositing an insulation layer on top of the insulating dielectric material, said insulation layer having a small opening in a vicinity of the protrusion of the first electrode, said small opening enabling contact between the second electrode and said insulating dielectric material.

* * * * *